(12) United States Patent
Fan et al.

(10) Patent No.: US 6,168,966 B1
(45) Date of Patent: Jan. 2, 2001

(54) FABRICATION OF UNIFORM AREAL SENSITIVITY IMAGE ARRAY

(75) Inventors: Yang Tung Fan, Hsinchu Chu; Chih-Hsiung Lee, Hsin-Chu, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/252,466

(22) Filed: Feb. 18, 1999

(51) Int. Cl.[7] .................................................... H01L 21/00
(52) U.S. Cl. .................................................................. 438/73
(58) Field of Search .................................. 438/73, 74, 75, 438/76, 77, 78, 79, 128, 129; 349/192; 257/452, 456

(56) References Cited

U.S. PATENT DOCUMENTS

| | | | |
|---|---|---|---|
| 5,276,540 | 1/1994 | Okamoto et al. | 359/59 |
| 5,672,519 | 9/1997 | Song et al. | 437/3 |
| 5,705,424 | 1/1998 | Zavracky et al. | 437/86 |
| 5,756,239 | 5/1998 | Wake | 430/7 |
| 5,858,810 | * 1/1999 | Takakura | 438/59 |

* cited by examiner

Primary Examiner—Charles Bowers
Assistant Examiner—Keith Christianson
(74) Attorney, Agent, or Firm—George O. Saile; Stephen B. Ackerman

(57) ABSTRACT

A method for forming an image array optoelectronic microelectronic fabrication. There is first provided a substrate. There is then formed at least in part over the substrate in a plane parallel to the substrate a bidirectional array of active image array optoelectronic microelectronic pixel elements. There is also formed over the substrate in the plane parallel to the substrate and contiguously extending from the bidirectional array of active image array optoelectronic microelectronic pixel elements an annular array of buffer image array optoelectronic microelectronic pixel elements. The annular array of buffer image array optoelectronic microelectronic pixel elements provides for uniform areal sensitivity of the bidirectional array of active image array optoelectronic microelectronic pixel elements.

6 Claims, 3 Drawing Sheets

FABRICATION OF UNIFORM AREAL SENSITIVITY IMAGE ARRAY

BACKGROUND OF THE INVENTION

1. Field of the Invention

The present invention relates generally to methods for fabricating image arrays within microelectronic fabrications. More particularly, the present invention relates to methods for fabricating with uniform areal sensitivity image arrays within microelectronic fabrications.

2. Description of the Related Art

Microelectronic fabrications are formed from microelectronic substrates over which are formed patterned microelectronic conductor layers which are separated by microelectronic dielectric layers. Within the general art of microelectronic fabrication, there exist microelectronic fabrications whose operation is based solely upon electrical signal storage and processing characteristics of microelectronic devices and microelectronic circuits formed upon a microelectronic substrate. Examples of such microelectronic fabrications typically include semiconductor integrated circuit microelectronic fabrications and ceramic substrate packaging microelectronic fabrications. Similarly, there also exists within the general art of microelectronic fabrication microelectronic fabrications whose operation is predicated upon a codependent transduction, storage and/or processing of optical and electrical signals while employing optoelectronic microelectronic devices formed upon a microelectronic substrate. Examples of such optoelectronic microelectronic fabrications typically include, but are not limited to: (1) solar cell optoelectronic microelectronic fabrications, as well as; (2) image array optoelectronic microelectronic fabrications, such as but not limited to: (a) sensor image array optoelectronic microelectronic fabrications (i.e. color filter sensor image arrays), as well as: (b) display image array optoelectronic microelectronic fabrications (i.e. flat panel display image arrays). Sensor image array optoelectronic microelectronic fabrications find common usage in advanced consumer products such as digital cameras, while display image array optoelectronic microelectronic fabrications are well recognized and commonly employed as visual interface elements within mobile computers.

While the level of complexity and integration of both purely electronic microelectronic fabrications and optoelectronic microelectronic fabrications continues to increase, fabrication of advanced optoelectronic microelectronic fabrications often provides unique fabrication challenges insofar as fabrication of advanced optoelectronic microelectronic fabrications requires attention to both the optical properties and the electrical properties of materials which are employed in forming such advanced optoelectronic microelectronic fabrications. For example, of the problems which are commonly encountered when fabricating advanced image array optoelectronic microelectronic fabrications, problems in achieving uniform areal sensitivity are often encountered.

It is thus towards the goal of forming advanced image array optoelectronic microelectronic fabrications with uniform areal sensitivity that the present invention is directed.

Various optoelectronic microelectronic fabrication methods and/or resulting optoelectronic microelectronic fabrications have been disclosed in the art of optoelectronic microelectronic fabrication for forming optoelectronic microelectronic fabrications with enhanced properties.

For example, Okamoto et al., in U.S. Pat. No. 5,276,540, discloses an active matrix thin film transistor (TFT) display image array optoelectronic microelectronic fabrication with reduced step height related defects typically encountered incident to fabricating a conductor layer shunt connecting an additional capacitance portion of a pixel electrode with a non-additional capacitance portion of the pixel electrode within the active matrix thin film transistor (TFT) display image array optoelectronic microelectronic fabrication. To realize the foregoing object, the active matrix thin film transistor (TFT) display image array optoelectronic microelectronic fabrication employs a pixel electrode of dimensions which completely cover the conductor layer shunt.

In addition, Song et al., in U.S. Pat. No. 5,672,519, discloses a method for fabricating a diode sensor image array optoelectronic microelectronic fabrication with enhanced optical precision when fabricating the diode sensor image array optoelectronic microelectronic fabrication. The method employs when fabricating the diode sensor image array optoelectronic microelectronic fabrication a stripe microlens having a flat top section rather than a stripe microlens having a convex top section as is more conventionally employed within diode sensor image array optoelectronic microelectronic fabrication.

Further, Zavracky et al., in U.S. Pat. No. 5,705,424, discloses a method for forming an active matrix thin film transistor (TFT) display image array optoelectronic microelectronic fabrication with enhanced switching speed. The method employs when forming the active matrix thin film transistor (TFT) display image array optoelectronic microelectronic fabrication electrical interconnect layers which are formed employing a monocrystalline silicon material rather than an amorphous silicon material as is more conventionally employed when fabricating active matrix thin film transistor (TFT) display image array optoelectronic microelectronic fabrications.

Finally, Wake, in U.S. Pat. No. 5,756,239, discloses a method for fabricating, with reduced process complexity, a color filter diode sensor image array optoelectronic microelectronic fabrication. The method employs when forming a series of patterned color filter layers from a corresponding series of blanket color filter layers which comprise the color filter diode sensor image array optoelectronic microelectronic fabrication a corresponding series of patterned photoresist layers which are chemically hardened against etching within an oxygen plasma which is employed for forming the series of patterned color filter layers from the series of blanket color filter layers.

Desirable in the art of optoelectronic microelectronic fabrication are additional methods and materials which may be employed for forming image array optoelectronic microelectronic fabrications with both uniform areal sensitivity.

It is towards that goal that the present invention is directed.

SUMMARY OF THE INVENTION

A first object of the present invention is to provide a method for forming an image array optoelectronic microelectronic fabrication.

A second object of the present invention is to provide a method for forming an image array optoelectronic microelectronic fabrication in accord with the first object of the present invention, where the image array optoelectronic microelectronic fabrication is formed with uniform areal sensitivity.

A third object of the present invention is to provide an image array optoelectronic microelectronic fabrication in accord with the first object of the present invention and the second object of the present invention, which method is readily commercially implemented.

In accord with the objects of the present invention, there is provided by the present invention a method for forming an image array optoelectronic microelectronic fabrication, and an image array optoelectronic microelectronic fabrication fabricated in accord with the method. To practice the method of the present invention, there is first provided a substrate. There is then formed over the substrate in a plane parallel to the substrate a bidirectional array of active image array optoelectronic microelectronic pixel elements. There is also formed over the substrate in the plane parallel to the substrate and contiguously extending from the bidirectional array of active image array optoelectronic microelectronic pixel elements an annular array of buffer image array optoelectronic microelectronic pixel elements.

There is provided by the present invention a method for forming an image array optoelectronic microelectronic fabrication, where the image array optoelectronic microelectronic fabrication is formed with uniform areal sensitivity. The present invention realizes the foregoing object by employing when forming the image array optoelectronic microelectronic fabrication a bidirectional array of active image array optoelectronic microelectronic pixel elements, where the bidirectional array of active image optoelectronic microelectronic pixel elements has formed contiguous thereto and extending annularly therefrom an annular array of buffer image array optoelectronic microelectronic pixel elements.

The method of the present invention contemplates an image array optoelectronic microelectronic fabrication fabricated in accord with the method of the present invention.

The present invention is readily commercially implemented. The present invention employs methods and materials as are generally known in the art of optoelectronic microelectronic fabrication, and more specifically known in the art of image array optoelectronic microelectronic fabrication. Since it is process control and design considerations which provide at least in part the present invention, rather than the existence of methods and materials which provides the present invention, the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming an image array optoelectronic microelectronic fabrication, where the image array optoelectronic microelectronic fabrication is formed with uniform areal sensitivity within an active image area of the image array optoelectronic microelectronic fabrication. The present invention realizes the foregoing object by employing when forming the image array optoelectronic microelectronic fabrication a bidirectional array of active optoelectronic microelectronic pixel elements, where the bidirectional array of active optoelectronic microelectronic pixel elements has formed contiguous thereto and extending therefrom an annular array of buffer image array optoelectronic microelectronic pixel elements.

Although the preferred embodiment of the present invention illustrates the present invention within the context of a color filter diode sensor image array optoelectronic microelectronic fabrication, the present invention may be employed for forming with uniform areal sensitivity image array optoelectronic microelectronic fabrications including but not limited to sensor image array optoelectronic microelectronic fabrications as well as display image array optoelectronic microelectronic fabrications.

Figure 1:
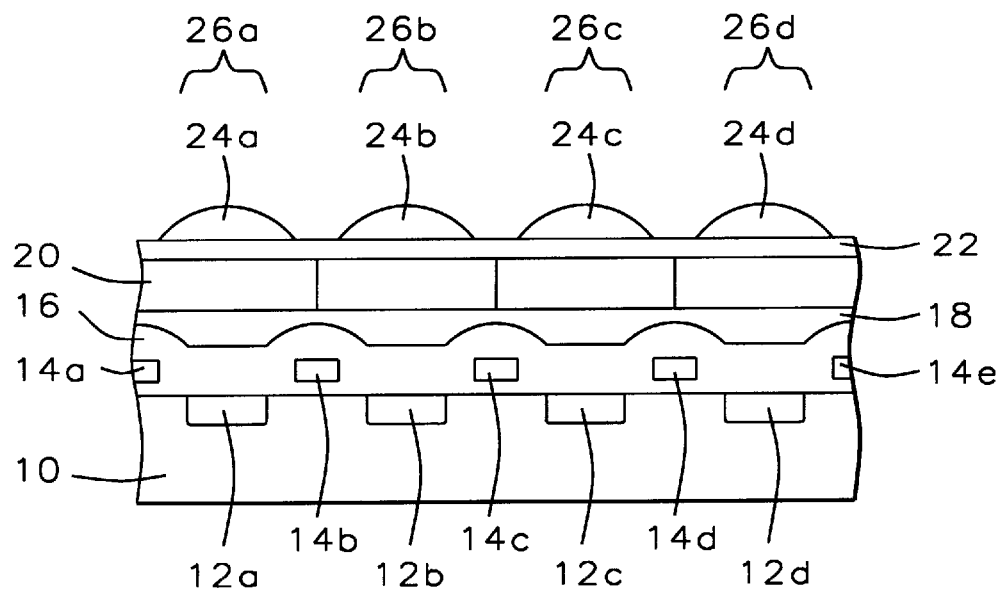
FIG. 1 shows a schematic cross-sectional diagram of a color filter diode sensor image array optoelectronic microelectronic fabrication which may be fabricated in accord with the present invention.

Referring now to FIG. 1, there is shown a schematic cross-sectional diagram illustrating a portion of a color filter diode sensor image array optoelectronic microelectronic fabrication which may be fabricated employing the present invention.

Shown within FIG. 1 is a substrate 10 having formed therein a series of photo active regions 12a, 12b, 12c and 12d. Within the preferred embodiment of the present invention, the substrate 10 is typically and preferably a silicon semiconductor substrate, and the photo active regions 12a, 12b, 12c and 12d are typically and preferably photodiode regions of the silicon semiconductor substrate. Typically and preferably, the silicon semiconductor substrate will have an N− or P− doping, while the photo active regions 12a, 12b, 12c and 12d will typically and preferably have a complementary P+ or N+ doping. Although FIG. 1 illustrates the substrate 10 as a flat substrate having the photo active regions 12a, 12b, 12c and 12d formed contiguously therein, it is understood by a person skilled in the art that the photo active regions 12a, 12b, 12c and 12d may also be formed topographically within the substrate 10, and the substrate 10 may also have formed therein additional appropriate layers and structures, such as but not limited to channel stop layers and structures, as are needed to adequately isolate the photo active regions 12a, 12b, 12c and 12d.

Shown also within FIG. 1 formed upon the substrate 10 including the photo active regions 12a, 12b, 12c and 12d of the substrate 10 is a blanket passivation layer 16 which has formed therein at locations alternating with the series of photo active regions 12a, 12b, 12c and 12d a series of vertical patterned conductor layers 14a, 14b, 14c, 14d and 14e. The series of vertical patterned conductor layers 14a, 14b, 14c, 14d and 14e typically serves as a first directional charge collection array within the color filter diode sensor image array optoelectronic microelectronics fabrication whose schematic cross-sectional diagram is illustrated in FIG. 1, while the blanket passivation layer 16 serves to separate the vertical patterned conductor layers 14a, 14b, 14c, 14d and 14e from the substrate 10.

Within the preferred embodiment of the present invention, the blanket passivation layer 16 is typically and preferably formed of a passivation material which is transparent to incident electromagnetic radiation for whose detection and classification the color filter diode sensor image array optoelectronic microelectronic fabrication whose schematic cross-sectional diagram is illustrated in FIG. 1 is designed. Typically and preferably, the blanket passivation layer 16 is formed of a passivation material selected from the group including but not limited to silicon oxide passivation materials, silicon nitride passivation materials, silicon oxynitride passivation materials and composites thereof. Similarly, within the preferred embodiment of the present invention, the patterned conductor layers 14a, 14b, 14c, 14d and 14e are each formed of a conductor material as is similarly conventional in the art of optoelectronic microelectronic fabrication, such conductor materials being selected from the group including but not limited to metal, metal alloy, doped polysilicon and polycide (doped polysilicon/metal silicide stack) conductor materials.

Shown also within FIG. 1 formed upon the blanket passivation layer 16 is a blanket planarizing layer 18, and there is similarly also shown within FIG. 1 formed upon the blanket planarizing layer 18 a blanket color filter layer 20. Within the preferred embodiment of the present invention, the blanket planarizing 18 layer and the blanket color filter layer 20 may be formed employing methods and materials as are conventional in the art of optoelectronic microelectronic fabrication. Typically and preferably, the blanket planarizing layer 18 is formed of a planarizing material which, similarly with the blanket passivation layer 16, is transparent to a spectrum of electromagnetic radiation whose detection and classification is effected while employing the color filter diode sensor image array optoelectronic microelectronic fabrication whose schematic cross-sectional diagram is illustrated in FIG. 1. Such planarizing materials may include, but are not limited to spin-on-glass (SOG) planarizing materials and spin-on-polymer (SOP) planarizing materials (such as, but not limited to photoresist spin-on-polymer (SOP) planarizing materials). For the preferred embodiment of the present invention, the blanket planarizing layer 18 is preferably formed of a spin-on-glass (SOG) planarizing material, preferably formed to a thickness of from about 20000 to about 30000 angstroms upon the blanket passivation layer 16.

Similarly, within the preferred embodiment of the present invention with respect to the blanket color filter layer 20, the blanket color filter layer 20 is typically and preferably formed employing methods analogous or equivalent to methods as disclosed within the references cited within the Description of the Related Art, in particular Song et al. and Wake, the teachings of which references are incorporated herein fully by reference. Although not specifically illustrated within the schematic cross-sectional diagram of FIG. 1, the blanket color filter layer 20 typically and preferably has several patterned color layers incorporated therein, as is conventional in the art of color filter diode sensor image array optoelectronic microelectronic fabrication.

Finally, there is shown in FIG. 1 formed upon the blanket color filter layer 20 a blanket spacer layer 22 having formed spaced thereupon a series of patterned microlens layers 24a, 24b, 24c and 24d. Within the preferred embodiment of the present invention, the blanket spacer layer 22 is preferably formed of a material which is intended to separate the series of patterned microlens 24a, 24b, 24c and 24d from the blanket color filter layer 20. Similarly with the blanket passivation layer 16 and the blanket planarizing layer 18, the blanket spacer layer 22 may be formed of spacer materials which are transparent to a spectrum of incident electromagnetic radiation whose detection and classification is effected by the color filter diode sensor image array optoelectronic microelectronic fabrication whose schematic cross-sectional diagram is illustrated in FIG. 1. Also similarly with the blanket passivation layer 16, the blanket spacer layer 22 may also be formed from a spacer material selected from the group consisting of silicon oxide materials, silicon nitride materials, silicon oxynitride materials, as well as photoresist spin-on-polymer (SOP) materials, and composites thereof. Typically and preferably, the blanket spacer layer 22 is formed to a thickness of from about 20000 to about 30000 angstroms upon the blanket color filter layer 20.

Finally, with respect to the series of patterned microlens layers 24a, 24b, 24c and 24d, the series of patterned microlens layers 24a, 24b, 24c and 24d is, as is conventional in the art of optoelectronic microelectronic fabrication, formed of a patterned photoresist material of appropriate optical properties, which patterned photoresist layer is then thermally reflowed to form the series of patterned microlens layers 24a, 24b, 24c and 24d of convex shape, as illustrated within the schematic cross-sectional diagram of the color filter diode sensor image array optoelectronic microelectronic fabrication whose schematic cross-sectional diagram is illustrated in FIG. 1.

As is illustrated within the schematic cross-sectional diagram of FIG. 1, each portion of the color filter diode sensor image array optoelectronic microelectronic fabrication whose schematic cross-sectional diagram is illustrated in FIG. 1 which includes a patterned microlens layer 24a, 24b, 24c or 24d, in conjunction with a corresponding photo active region 12a, 12b, 12c or 12d of the substrate 10 comprises an active pixel element 26a, 26b, 26c or 26d.

Figure 2:
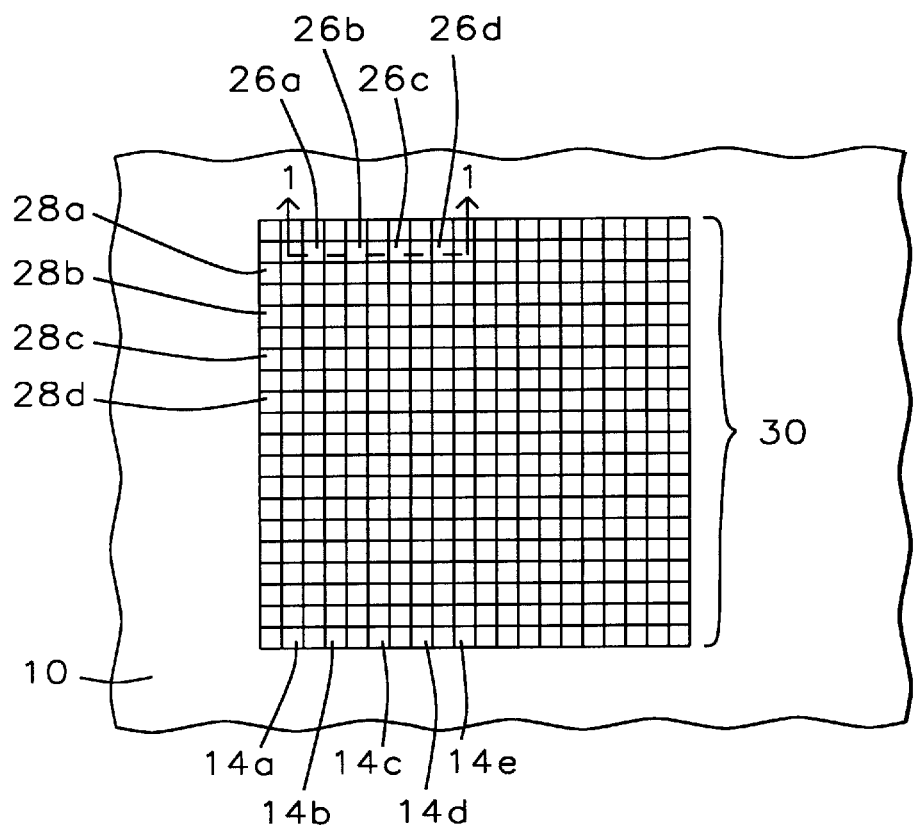
FIG. 2 shows a schematic plan-view diagram of the color filter diode sensor image array optoelectronic microelectronic fabrication whose schematic cross-sectional diagram is illustrated in FIG. 1.

Referring now to FIG. 2, there is shown a schematic plan-view diagram of a color filter diode sensor image array optoelectronic microelectronic fabrication which corresponds with and has incorporated therein the color filter diode sensor image array optoelectronic microelectronic fabrication whose schematic cross-sectional diagram is illustrated in FIG. 1.

Shown in FIG. 2 is the substrate 10 having formed thereover and incorporated therein a bidirectional array of active pixel elements 30 including the active pixel elements 26a, 26b, 26c, and 26d, where the bidirectional array of active pixel elements 30 is separated in a vertical direction by a series of vertical patterned conductor layers including the vertical patterned conductor layers 14a, 14b, 14c, 14d and 14e as originally illustrated within the schematic cross-sectional diagram of FIG. 1. Similarly, there is also shown within FIG. 2 a series of horizontal patterned conductor layers 28a, 28b, 28c and 28d which are not otherwise illustrated within the schematic cross-sectional diagram of FIG. 1, but are nonetheless formed employing methods, materials and dimensions analogous or equivalent to the methods, materials and dimensions employed for forming the series of vertical patterned conductor layers including the vertical patterned conductor layers 14a, 14b, 14c, 14d and 14e.

Within the color filter diode image sensor array optoelectronic microelectronic fabrication whose schematic plan-view diagram is illustrated within FIG. 2, each active pixel element within the bidirectional array of active pixel elements 30 is actively employed in detecting and classifying incident electromagnetic radiation. While the color filter diode sensor image array optoelectronic microelectronic fabrication whose schematic plan-view diagram is illustrated in FIG. 2 typically generally realizes that object, the color filter diode sensor image array optoelectronic microelectronic fabrication whose schematic plan-view diagram is illustrated within FIG. 2 is often susceptible to defects which detract from uniform areal sensitivity of the color filter diode sensor image array optoelectronic microelectronic fabrication whose schematic cross-sectional diagram is illustrated in FIG. 2.

It has been determined, incident to the present invention, that defects within the color filter diode sensor image array optoelectronic microelectronic fabrication whose schematic plan-view diagram is illustrated in FIG. 2 which provide non-uniform areal sensitivity of the color filter diode sensor image array optoelectronic microelectronic fabrication whose schematic cross-sectional diagram is illustrated in FIG. 2 are generally more prevalent within the active pixel elements formed at the periphery of the bidirectional array of active pixel elements 30 than at the active pixel elements formed within interior portions of the bidirectional array of active pixel elements 30. Incident to this observation, there is shown within FIG. 3 a color filter diode sensor image array optoelectronic microelectronic fabrication fabricated in accord with a preferred embodiment of the present invention. The color filter diode sensor image array optoelectronic microelectronic fabrication whose schematic plan-view diagram is illustrated within FIG. 3 exhibits a more uniform areal sensitivity within a bidirectional array of active pixel elements than does the color filter diode sensor image array optoelectronic microelectronic fabrication whose schematic plan-view diagram is illustrated in FIG. 2.

Figure 3:
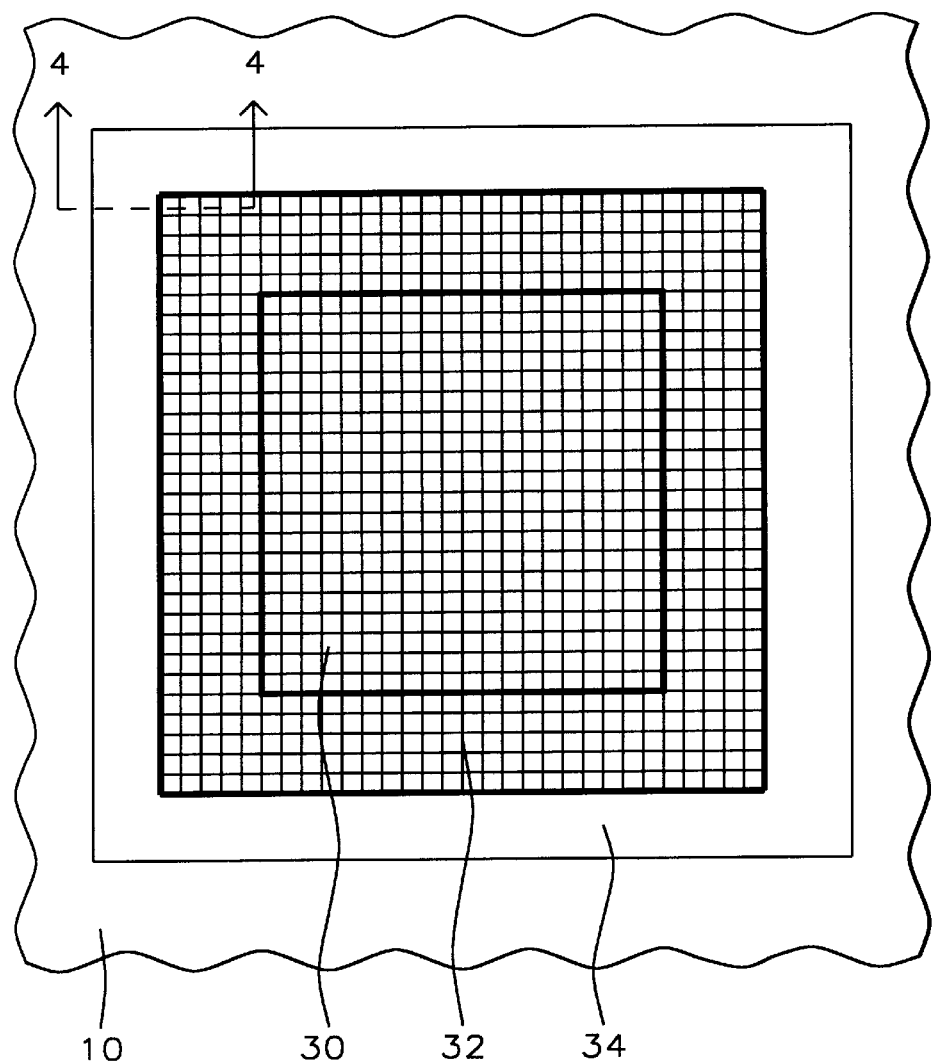
FIG. 3 shows a schematic plan-view diagram of a color filter diode sensor image array optoelectronic microelectronic fabrication incorporating therein the color filter diode sensor image array optoelectronic microelectronic fabrication whose schematic plan-view diagram is illustrated within FIG. 2 and further fabricated in accord with a preferred embodiment of the present invention.

As is shown within FIG. 3, there is formed contiguously surrounding the bidirectional array of active pixel elements 30 and annularly extending from the bidirectional array of active pixel elements 30, while being coplanar with the bidirectional array of active pixel elements 30, an annular array of buffer pixel elements 32. Within the preferred embodiment of the present invention, while the buffer pixel elements within the annular array of buffer pixel elements 32 are formed employing methods, materials and dimensions analogous or equivalent to the methods, materials and dimensions employed for forming the active pixel elements within the bidirectional array of active pixel elements 30, the buffer pixel elements within the annular array of buffer pixel elements 32 are not employed for detection and classification of electromagnetic radiation while employing the color filter diode sensor image array optoelectronic microelectronic fabrication whose schematic cross-sectional diagram is illustrated in FIG. 3. More preferably, although each buffer pixel element within the annular array of buffer pixel elements 32 is formed employing methods, materials and dimensions analogous or equivalent to the methods, materials and dimensions employed for forming each active pixel element within the bidirectional array of active pixel elements 30, each buffer pixel elements within the annular array of buffer pixel elements 32 is not electrically incorporated into an image analysis while employing the color filter diode sensor image array optoelectronic microelectronic fabrication whose schematic plan-view diagram is illustrated in FIG. 3.

It is believed that many of the edge related defects which are typical within the bidirectional array of active pixel elements 30 whose schematic plan-view diagram is illustrated in FIG. 2 are derived from undercutting, dl ion, inhomogeneous edge fabrication and compromised linewidth control within active pixel elements within the periphery of the color filter diode sensor image array optoelectronic microelectronic fabrication whose schematic plan-view diagram is illustrated in FIG. 2. By employing within the present invention contiguous with the bidirectional array of active pixel elements 30 the annular array of buffer pixel elements 32 as illustrated within the schematic plan-view diagram of FIG. 3, such undercutting, delamination, inhomogeneous edge fabrication and compromised linewidth control are believed to be avoided.

Similarly, there is also shown within the schematic plan-view diagram of FIG. 3 contiguous with the annular array of buffer pixel elements 32 and further spaced from the bidirectional array of active pixel elements 30 an annular buffer non-array 34. Within the preferred embodiment of the present invention, the annular buffer non-array 34 is formed of intermediate step height between: (1) the coplanar bidirectional array of active pixel elements 30 and annular array of buffer pixel elements 32; and (2) the substrate 10. Within the preferred embodiment of the present invention, it is intended and believed that the annular buffer non-array 34 provides, in conjunction with the annular array of buffer pixel elements 32, for an additional smoothing transition region between the bidirectional array of active pixel elements 30 and the substrate 10, to thus further contribute to reduction in defects within the color filter diode sensor image array optoelectronic microelectronic fabrication whose schematic plan-view diagram is illustrated within FIG. 3.

Figure 4:
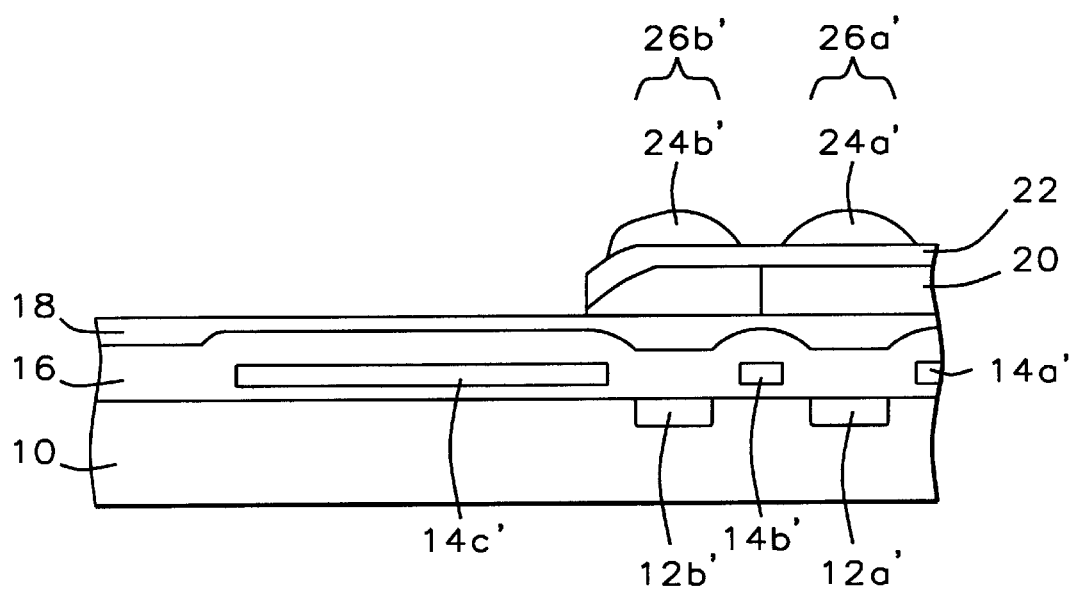
FIG. 4 shows a schematic cross-sectional diagram of a portion of the color filter diode sensor image array optoelectronic microelectronic fabrication whose schematic plan-view diagram is illustrated in FIG. 3.

Referring now to FIG. 4, there is shown a schematic cross-sectional diagram corresponding with sectional line 4—4 of the color filter diode sensor image array optoelectronic microelectronic fabrication whose schematic cross-sectional diagram is illustrated in FIG. 3.

Shown in FIG. 4 are buffer pixel elements 26a' and 26b' within the annular array of buffer pixel elements 32 as illustrated within the schematic plan-view diagram of FIG. 3. The pair of buffer pixel elements 26a' and 26b' is formed employing methods, materials and dimensions analogous or equivalent to the methods, materials and dimensions employed for forming the series of active pixel elements 26a, 26b, 26c and 26d as illustrated within the schematic cross-sectional diagram of FIG. 1, with the exception that the blanket color filter layer 20 is tapered at its outboard edge of buffer pixel element 26b', thus contributing to a skewing of the patterned microlens layer 24b', which skewing if present within the bidirectional array of active pixel elements 30 as illustrated within the schematic plan-view diagram of FIG. 2 or the schematic plan-view diagram of FIG. 3 would compromise uniform areal sensitivity of the bidirectional array of active pixel elements 30. In addition to the tapering of the blanket color filter layer 20 as illustrated within the schematic cross-sectional diagram of FIG. 1, as noted above, other edge related defects which might contribute to non-uniform areal sensitivity of the bidirectional array of active pixel elements 30 might include undercutting, delamination and inhomogeneous edge fabrication.

As is similarly illustrated within the schematic cross-sectional diagram of FIG. 4, within the annular buffer non-array 34 as illustrated within FIG. 3 there is formed an extended patterned conductor layer 14c' surrounded by the blanket passivation layer 16 and planarized by the blanket planarizing layer 18. Within the annular buffer non-array 34 there is eliminated the blanket color filter layer 20, the blanket spacer layer 22 and any patterned microlens layers, for reasons as discussed above.

As is understood by a person skilled in the art, the preferred embodiment of the present invention is illustrative of the present invention rather than limiting of the present invention. Revisions and modifications may be made to methods, materials, structures and dimensions which are employed to form a color filter diode sensor image array optoelectronic microelectronic fabrication in accord with the preferred embodiment of the present invention while still forming an image array optoelectronic microelectronic fabrication in accord within the present invention, as defined by the appended claims.

What is claimed is:

1. A method for forming an image array optoelectronic microelectronic fabrication comprising:

providing a substrate;

forming at least in part over the substrate in a plane parallel to the substrate a bidirectional array of active image array optoelectronic microelectronic pixel elements; and forming also over the substrate in the plane parallel to the substrate and contiguously extending from the bidirectional array of active image array optoelectronic microelectronic pixel elements an annular array of buffer image array optoelectronic microelectronic pixel elements, wherein said annular array of buffer image array pixel elements are not electrically incorporated into an image analysis.

2. The method of claim 1 wherein the annular array of buffer image array optoelectronic microelectronic pixel elements provides for uniform areal sensitivity of the bidirectional array of active image array optoelectronic microelectronic pixel elements.

3. The method of claim 1 wherein the substrate is employed within an image array optoelectronic microelectronic fabrication selected from the group consisting of sensor image optoelectronic microelectronic fabrications and display image array optoelectronic microelectronic fabrications.

4. The method of claim 1 further comprising forming over the substrate and further extending from the annular array of buffer image array optoelectronic microelectronic pixel elements an annular buffer non-array.

5. The method of claim 4 wherein:

the bidirectional array of active image array optoelectronic microelectronic pixel elements, and the annular array of buffer image array optoelectronic microelectronic pixel elements are formed with nominally equivalent step height with respect to the substrate; and the annular buffer non-array is formed with an intermediate step height with respect to both the bidirectional array of active image array optoelectronic microelectronic pixel elements, and the annular array of buffer image array optoelectronic microelectronic pixel elements with reference to the substrate.

6. The method of claim 1 wherein said forming an array of active pixel elements and said forming an annular array of buffer pixel elements employ methods, materials and dimensions equivalent to each other.

* * * * *